United States Patent
Chen et al.

(10) Patent No.: US 11,204,400 B2
(45) Date of Patent: Dec. 21, 2021

(54) ANALYZING FLUIDS IN CORE SAMPLES CONTAINED IN PRESSURIZED NMR CORE HOLDERS WITH 1H AND 19F NMR

(71) Applicant: Halliburton Energy Services, Inc., Houston, TX (US)

(72) Inventors: Songhua Chen, Katy, TX (US); Donald Clifford Westacott, Spring, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 0 days.

(21) Appl. No.: 16/937,586

(22) Filed: Jul. 24, 2020

(65) Prior Publication Data

US 2020/0355763 A1 Nov. 12, 2020

Related U.S. Application Data

(62) Division of application No. 15/559,825, filed as application No. PCT/US2016/052591 on Sep. 20, 2016, now Pat. No. 10,761,157.

(51) Int. Cl.
| | | |
|---|---|---|
| *G01R 33/30* | (2006.01) | |
| *G01N 24/08* | (2006.01) | |
| *E21B 25/08* | (2006.01) | |
| *E21B 47/00* | (2012.01) | |
| *E21B 49/02* | (2006.01) | |

(Continued)

(52) U.S. Cl.
CPC ............ *G01R 33/305* (2013.01); *E21B 25/00* (2013.01); *E21B 25/08* (2013.01); *E21B 47/00* (2013.01); *E21B 49/02* (2013.01); *E21B 49/06* (2013.01); *G01N 24/081* (2013.01); *G01V 3/14* (2013.01);

(Continued)

(58) Field of Classification Search
CPC .. G01R 33/305; G01R 33/448; G01N 24/081; G01V 3/14; E21B 25/08; E21B 47/00; E21B 49/02; E21B 25/00; E21B 49/06; E21B 49/0875; E21B 10/02
See application file for complete search history.

(56) References Cited

U.S. PATENT DOCUMENTS

| 5,325,723 A | 7/1994 | Meadows et al. |
|---|---|---|
| 7,567,079 B2 | 7/2009 | Chen et al. |

(Continued)

FOREIGN PATENT DOCUMENTS

| WO | 2013101695 A2 | 7/2013 |
|---|---|---|
| WO | 2013171544 A1 | 11/2013 |

OTHER PUBLICATIONS

EP Application Serial No. 16916920.8, Extended European Search Report, dated Jun. 21, 2019, 8 pages.

(Continued)

*Primary Examiner* — Farhana A Hoque
(74) *Attorney, Agent, or Firm* — Gilliam IP PLLC

(57) ABSTRACT

Pressure coring where the core apparatus drills the core sample and seals the core sample at its native downhole pressure (e.g., several thousand psi) may be expanded to include nuclear magnetic resonance (NMR) imaging components to produce a pressurized NMR core holder that allows for NMR imaging of the core samples having been maintained in a downhole fluid saturation state. NMR imaging performed may include 1H and also 19F imaging depending on the chamber fluid used in the pressurized NMR core holder.

20 Claims, 4 Drawing Sheets

(51) Int. Cl.
  *G01V 3/14* (2006.01)
  *E21B 25/00* (2006.01)
  *E21B 49/06* (2006.01)
  *G01R 33/44* (2006.01)
  *E21B 49/08* (2006.01)
  *E21B 10/02* (2006.01)

(52) U.S. Cl.
  CPC .......... *E21B 10/02* (2013.01); *E21B 49/0875* (2020.05); *G01R 33/448* (2013.01)

(56) References Cited

U.S. PATENT DOCUMENTS

| | | |
|---|---|---|
| 2003/0006767 A1 | 1/2003 | Georgi et al. |
| 2003/0006768 A1 | 1/2003 | Kleinberg et al. |
| 2004/0091937 A1 | 5/2004 | Dalvit et al. |
| 2011/0050223 A1 | 3/2011 | Balcom et al. |
| 2011/0094801 A1* | 4/2011 | Buchanan ............... E21B 49/06 175/249 |
| 2013/0261979 A1 | 10/2013 | Al-Muthana et al. |
| 2014/0000358 A1 | 1/2014 | Badri et al. |
| 2014/0091800 A1 | 4/2014 | Fordham |
| 2014/0340082 A1 | 11/2014 | Yang et al. |

OTHER PUBLICATIONS

PCT Application Serial No. PCT/US2016/052591, International Search Report, dated Jun. 7, 2017, 3 pages.

PCT Application Serial No. PCT/US2016/052591, International Written Opinion, dated Jun. 7, 2017, 9 pages.

U.S. Appl. No. 15/559,825, Notice of Allowance, dated Apr. 23, 2020, 9 pages.

Halliburton, "CoreVault Fluid and Rock Sampling System, Formation Evaluation", 2014, 1 pages.

* cited by examiner under pressure. The methods of the present
ANALYZING FLUIDS IN CORE SAMPLES CONTAINED IN PRESSURIZED NMR CORE HOLDERS WITH 1H AND 19F NMR

BACKGROUND

The present application relates to analyzing core samples with nuclear magnetic resonance (NMR) imaging, relaxometry, and diffusimetry.

Often samples of subterranean formations referred to as core samples are acquired via core drilling methods. The core samples are then analyzed to determine the properties (e.g., porosity, hydrocarbon content, water content, organic matter content, mineralogy content including shale content, pore structure content, and the like) of the portion of the formation from which they were acquired.

In order to analyze core samples from a subterranean formation, a core apparatus drills a core sample. Once at the surface, the core sample is often preserved by hermetically sealing the core sample in a thick coating of wax or by freezing with dry ice. The purpose of preservation is primarily to maintain the core and any fluids therein and the distribution of those fluids in the core sample as close as possible to reservoir conditions. However, as the native pressure of the core sample is invariably much higher than the pressure at the surface, the gases and light fluids that may have been trapped in the rock will escape from the core sample as it is brought to the surface thus making the core sample less accurate in providing a picture of the subterranean formation from which the core sample was taken.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

The present application relates to analyzing core samples with nuclear magnetic resonance (NMR) imaging, relaxometry, and diffusimetry while the core samples are contained in a pressurized NMR core holder.

The methods of the present disclosure expand on pressure coring where the core apparatus drills the core sample and seals the core sample at its native downhole pressure (e.g., several thousand psi). Pressure coring mitigates the escape of pressurized gases and more effectively maintains the core sample in its native state for analysis. The methods of the present disclosure integrate NMR capabilities with the pressure coring.

Figure 1:
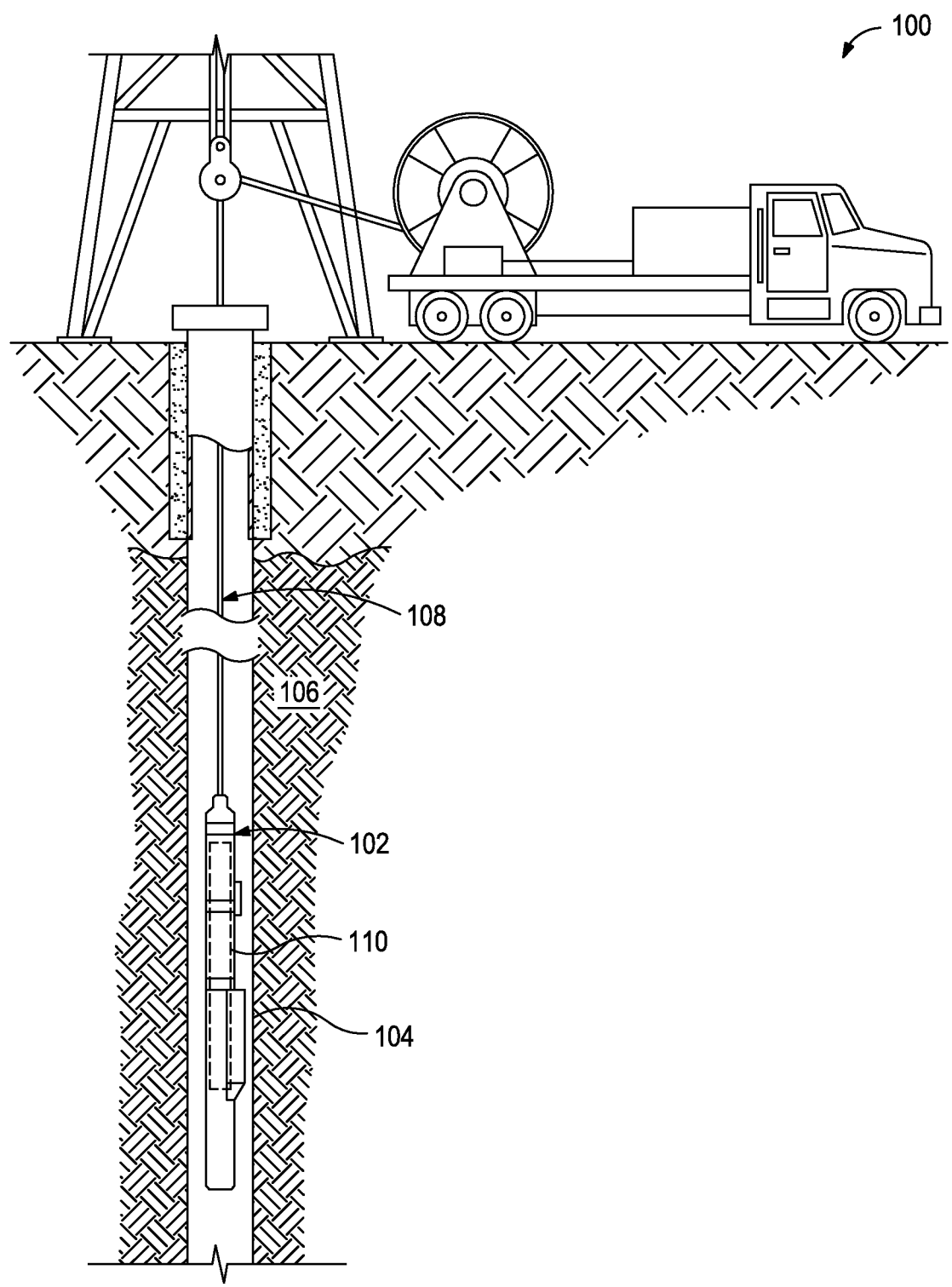
FIG. 1 illustrates an example system for collecting core samples and storing the core samples in a pressurized NMR core holder.

To briefly describe the hardware for implementing the methods of the present application, the pressurized NMR core holders described herein, and variations thereof, may be used in conjunction with a coring device downhole. For example, FIG. 1 shows an example system 100 for collecting core samples and storing the core samples in a pressurized NMR core holder. In FIG. 1, a coring tool 102 is placed in a wellbore 104 penetrating a subterranean formation 106 by a conveyance, illustrated as a wireline 108 conveyance. The coring tool 102 includes a pressurized NMR core holder 110 described herein. In certain example embodiments, the coring tool 102 is placed in the wellbore 104 by another conveyance (e.g., coil tubing, wired coiled tubing, slickline, and the like) that is connectable to the surface.

One skilled in the art would recognize the variations of the system 100 that may be employed when performing the methods described herein. For example, the system 100 may be implemented with a portion of the wellbore 104 that is off-vertical (e.g., deviated or horizontal).

Figure 2A:
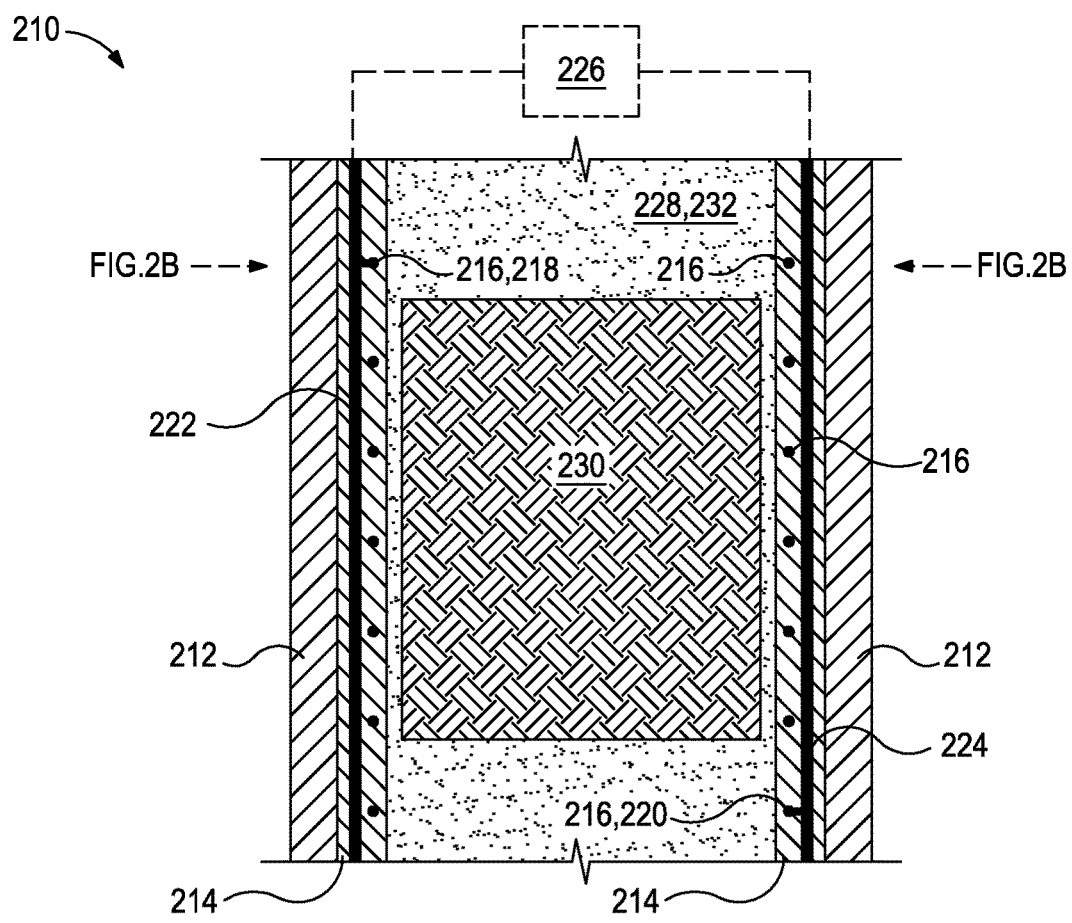
FIGS. 2A and 2B illustrate a cross-sectional side view and cross-sectional top view of a portion of a pressurized NMR core holder.
Figure 2B:
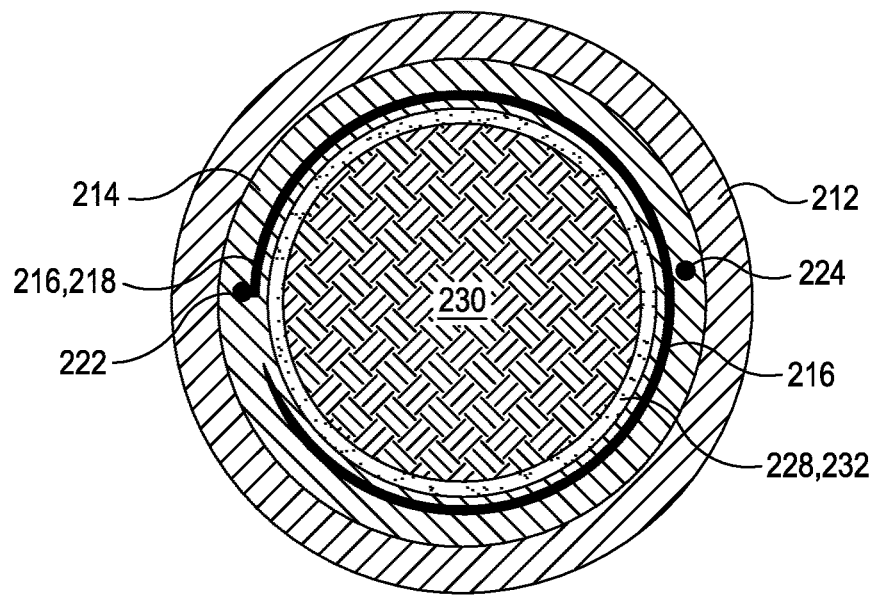

FIGS. 2A and 2B illustrate a cross-sectional side view and cross-sectional top view of a portion of a pressurized NMR core holder 210. The pressurized NMR core holder 210 includes a housing 212 that is capable of containing downhole fluid pressures. A coil holder 214 lines the inside of the housing 212 and maintains one or more NMR coils 216 in position. Each end 218, 220 of the NMR coil 216 is connected to a different wire 222, 224 that allows for connection to a control system 226.

The control system 226 may be a singular system outside the pressurized NMR core holder 210. For example, the pressurized NMR core holder 210 may include connections that can be used to connect to the control system 226 for NMR measurements. Alternatively, a portion of the control system 226 (e.g., capacitors) may be mounted inside the pressurized NMR core holder 210 and then coupled to the remainder of the control system 226 for NMR measurements.

A core chamber 228 is defined by the coil holder 214 and the housing 212 and is where the core sample 230 is placed. The pressurized NMR core holder 210 may be sufficiently sized to hold between one and twenty core samples 230.

Generally, the core samples 230 are stored in the pressurize NMR core holder 210 to effectively maintain the reservoir fluids in the core sample in a downhole fluid saturation state. As used herein, the term "downhole fluid saturation state" refers to a state where at least 75% of the fluid in the core sample 230 present when collecting the core sample 230 is maintained in the core sample 230. To achieve a downhole fluid saturation state, the pressurize NMR core holder 210 may maintain a temperature and/or a pressure at or near the downhole collection conditions. In some instances, the fluid pressure in the pressurize NMR core holder 210 may be within about 25% or, more preferably, within about 10% of the fluid pressure the core sample 230 was collected from the formation at. In some instances, the temperature in the pressurize NMR core holder 210 may be within about 25% or, more preferably, within about 10% of the temperature the core sample 230 was collected from the formation at. In some instances, both the temperature and fluid pressure in the pressurize NMR core holder 210 may independently be within about 25% or, more preferably, within about 10% of the temperature and the fluid pressure the core sample 230 was collected from the formation at.

The pressurize NMR core holder 210 may include a cover at one or more ends of the pressurize NMR core holder 210 that can be selectively moved between (1) an open position, where the one or more core samples 230 are able to be inserted into the pressurize NMR core holder 210, and (2) a closed position, where the pressurize NMR core holder 210 is sealed. Accordingly, a cover activation mechanism may be coupled to the pressurize NMR core holder 210 and operable to move the cover between the closed position and the open position.

To maintain the core sample 230 at an elevated temperature, additional thermal components may be added to the pressurized NMR core holder 210 and/or a downhole tool the pressurized NMR core holder 210 is a part of.

Further, the core chamber 228 may be filled with a fluid 232 (also referred to herein as a chamber fluid) (e.g., a non-reactive heavy weight fluid) that is suitable for applying positive pressure to the core samples to mitigate fluids from coming out of the core samples, thereby retaining the core samples native state (or similar thereto) for the later NMR measurements and analysis, as described further herein.

Figure 3:
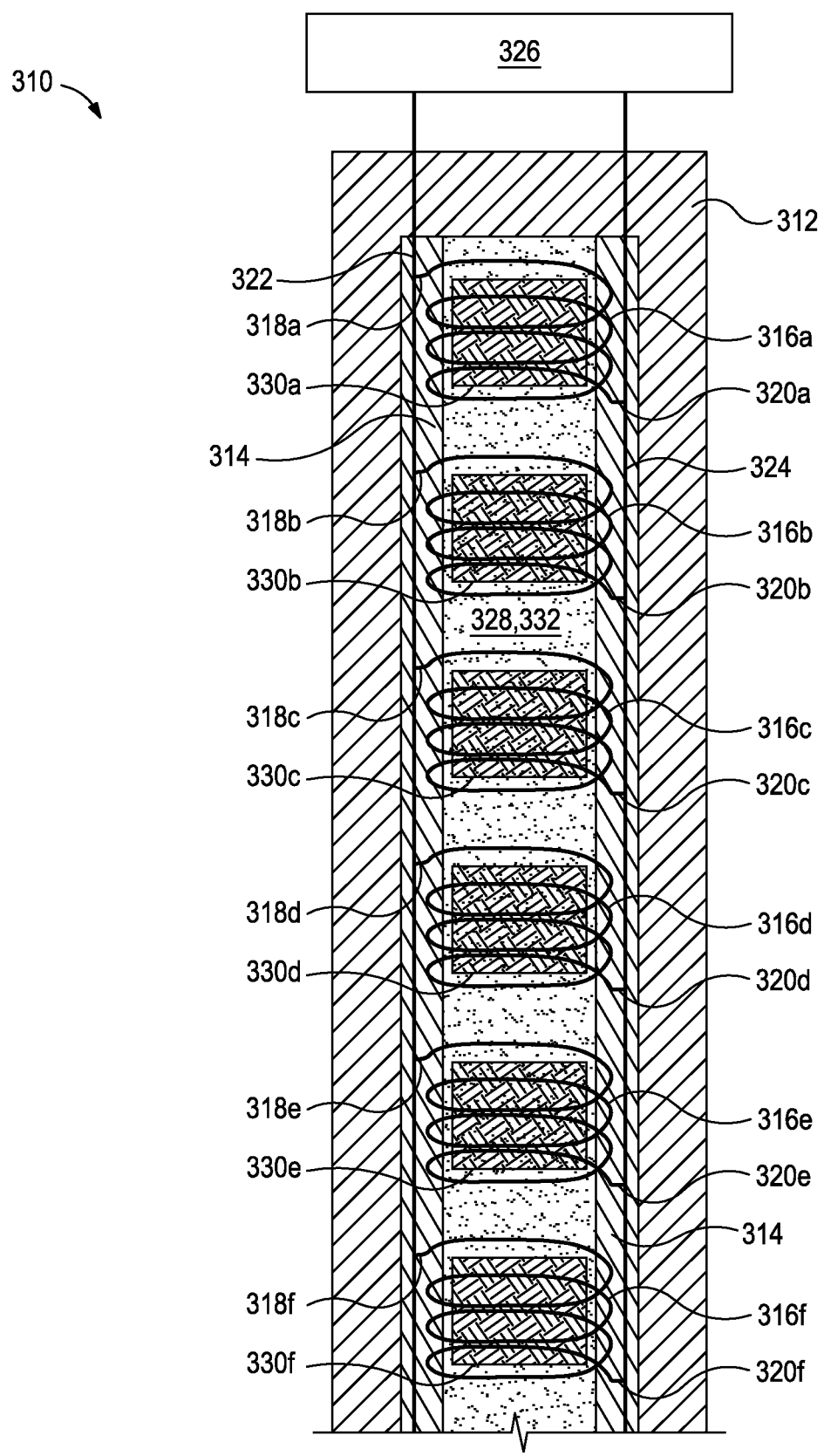
FIG. 3 illustrates a partial cross-sectional side view of a portion of a pressurized NMR core holder.

FIG. 3 illustrates a partial cross-sectional side view of a portion of a pressurized NMR core holder 310. The illustrated portion of the NMR core holder 310 includes six NMR coils 316a-f in a coil holder 314 and a housing 312. Each end 318a-f, 320a-f of the NMR coils 316a-f is connected to wires 322, 324, respectively. While FIG. 3 illustrates the wires 322, 324 extending through the housing 312, one skilled in the art would recognize that the housing 312 would include ports, seals, and the like to connect wires 322, 324 to a control system 326.

In some embodiments, a coring tool (e.g., as illustrated in FIG. 1 or a variation thereof) (e.g., a sidewall coring tool that extracts core samples from the sidewall of a wellbore or a bottom-hole coring tool that extracts core samples from the bottom of a wellbore) may collect or otherwise acquire core samples from one or more locations within the wellbore and stored in pressurized NMR core holder (e.g., as illustrated in FIG. 2A, FIG. 2B, FIG. 3, or a variation thereof).

As illustrated in FIG. 3, six core samples 330a-f have been placed in the core chamber 328 of the coil holder 314 at locations along the length of the pressurized NMR core holder 310 corresponding to the six NMR coils 316a-f. The core chamber 328 further contains the fluid 332. Then, when retrieved from the wellbore, the pressurized NMR core holder 310 may be connected to the control system 326 (or a portion thereof if some of the control system 326 is part of the pressurized NMR core holder 310) and placed in a magnetic field for taking NMR measurements.

The magnetic field may be generated by a plurality of methods. For example, an electromagnet, a superconducting magnet, a permanent magnet, or a permanent magnet array (e.g., a Halbach array) may be used. The magnets may encompass the pressurized NMR core holder. Alternatively, for permanent magnets, two plate magnets may be placed radially opposing each other relative to the pressurized NMR core holder. Other configuration of magnets can also be implemented to generate a substantially uniform magnetic field inside the core sample volume.

The magnets may be configured to provide a magnetic field along the length of the pressurized NMR core holder. Alternatively, a smaller length magnet (e.g., corresponding to the length of one to a few of the NMR coils) may be used and moved along the pressurized NMR core holder when performing NMR measurements and analysis.

Figure 4:
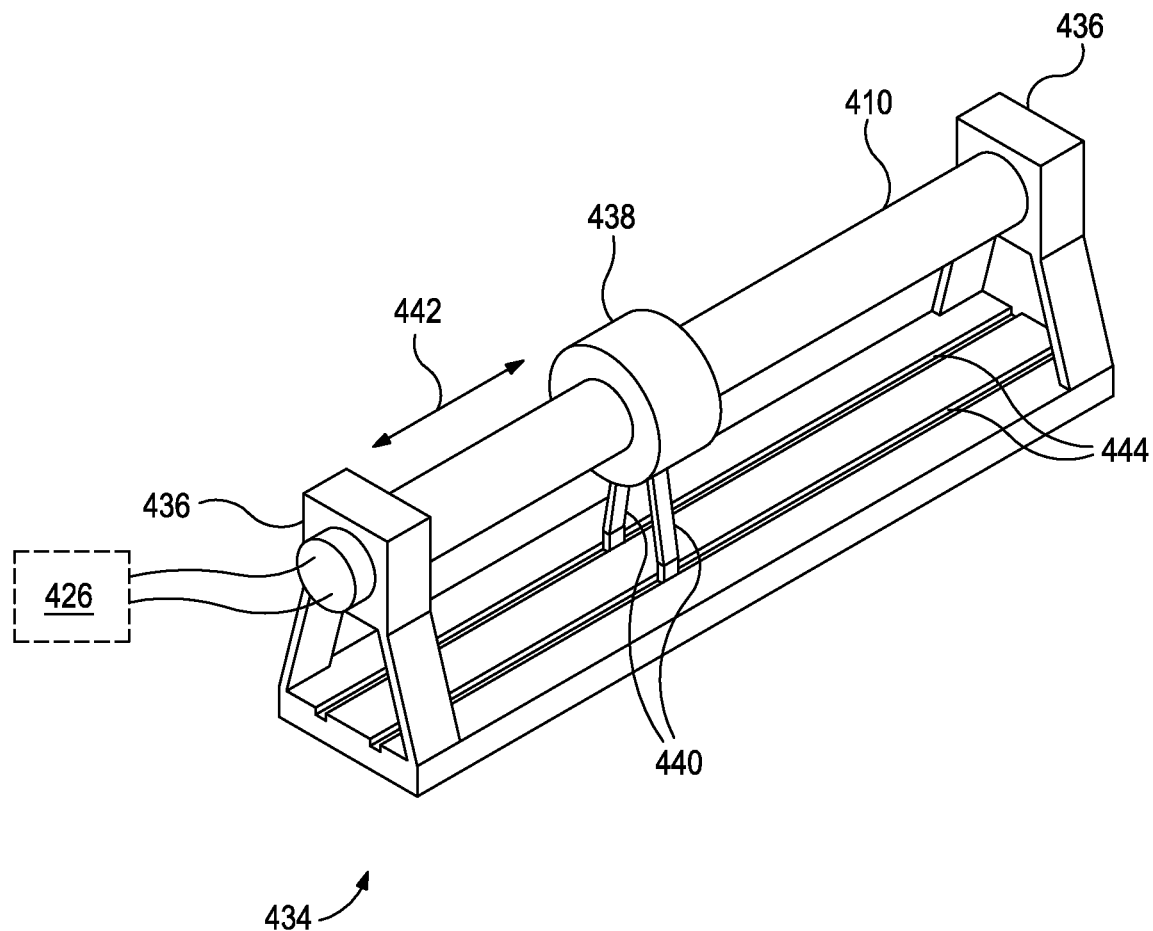
FIG. 4 illustrates an NMR analysis device with a pressurized NMR core holder therein.

For example, FIG. 4 illustrates an NMR analysis device 434 with a pressurized NMR core holder 410 therein. The NMR analysis device 434 includes a holder 436 that maintains the pressurized NMR core holder 410 in a desired position and a magnet 438. The illustrated magnet 438 is on a stand 440 that is longitudinally movable 442 along rails 444 of the NMR analysis device 434. As discussed above, the magnet 438 may be an appropriate length to provide a magnetic field for one to several of the NMR coils in the pressurized NMR core holder 410. The pressurized NMR core holder 410 is further coupled to a control system 426.

In alternate embodiments, the NMR analysis device may include more than one magnet that is longitudinally movable along the pressurized NMR core holder. This may allow for having two different strength magnets for performing different NMR measurements (e.g., on different atomic nuclei, different resolution measurements, or different sensitivity measurements).

The methods of the present disclosure integrate NMR capabilities with the pressure coring using the foregoing pressurized NMR core holders and NMR analysis devices, and suitable variations thereof.

In the methods of the present application, the chamber fluid (e.g., the fluid 232 illustrated in FIGS. 2A and 2B and fluid 332 of FIG. 3) is preferably high density, high viscosity, and high-temperature stable fluids with limited ability to solubilize water and provide electrical insulation. Examples of chamber fluids may include, but are not limited to, silicon oil, halogenated hydrocarbons (i.e., having at least one H of the hydrocarbon substituted with a halogen), perhalogenated hydrocarbons (i.e., having all H of the hydrocarbon substituted with a halogen), and the like, and any combination thereof. Exemplary halogenated hydrocarbons and perhalogenated hydrocarbons may include, but are not limited to, polychlorinated biphenyls, perfluorocarbons, perchlorocarbons, and the like, and any combination thereof. For example, FLUORINERT™ ELECTRONIC LIQUID FC-40 is a fully-fluorinated liquid available from 3M.

In some instances, a hydrogen-absent fluid (e.g., a perfluorocarbon or a perchlorocarbon) may be used as the chamber fluid to mitigate any contributions of the chamber fluid to the 1H (hydrogen-1) NMR measurements.

In some embodiments, the chamber fluid may be a fluorinated compound, thereby allowing for the NMR analysis methods described herein to include not only 1H NMR measurements but also 19F (fluorine-19) NMR measurements. Unless otherwise specified, the term "NMR measurements" refers to generally to NMR measurements and may include only 1H NMR measurements, only 19F NMR measurements, or both 1H and 19F NMR measurements.

In some instances, the chamber fluid may include weighting agents or viscosifiers dispersed therein to increase the viscosity and density of the chamber fluid to mitigate the fluid in the core samples leaking into the chamber fluid. For example, when using a perfluorocarbon chamber fluid, a perfluoropolymer may be used to viscosify the perfluorocarbon to provide for a hydrogen-absent chamber fluid and/or a fluorinated chamber fluid. In another example, weighting agents like barite and galena may be used to achieve a desired density of the chamber fluid, and the diameter of the weighting agents may be adjusted to achieve a desired viscosity of the chamber fluid.

The NMR analysis device may take NMR measurements of one or more core samples collected from one or more locations within a wellbore and stored in the pressurized NMR core holder. For example, in some instances, a coring tool having a pressurized NMR core holder may be retrieved from the wellbore after collecting one or more core samples, the pressurized NMR core holder removed from the coring tool, and the core sample(s) contained in the pressurized NMR core holder analyzed with the NMR analysis device separate from the coring tool.

The NMR measurements taken of the core sample may be analyzed to determine a variety of properties of the core sample. For example, 1H NMR measurements may include, but are not limited to, spin-echo intensity, Carr, Purcell, Meiboom and Gill (CPMG) echo train for T2 (spin-spin) relaxation times, inversion recovery experiments or saturation recovery experiments for T1 (spin-lattice) relaxation times, free-induction decay experiments, pulsed or constant gradient spin echo or stimulated echo experiments for relaxation time and fluid diffusivity, variable echo time (TE) experiments, and the like, and any combination thereof. Known methods may use the measurements described above to derive the properties of the core sample like porosity, movable and non-movable fluids, hydrocarbon fluid types and saturation, wettability, organic content, pore structure including pore size distribution, permeability, fracture and pore connectivity, and the like, and any combination thereof.

It should be noted that deriving a property of the core sample is not necessarily a singular number but rather may be presented in a variety of ways. For example, a numerical range that represents an estimation of the property value for the portion of the formation from which the core sample were taken may be the output of deriving a property. In another example, deriving a property may produce an image of the property for the core sample. For instances, deriving the oil-to-water ratio may be represented by an image illustrating the oil-to-water ratio at different locations in the core sample. As used herein, the term "image" may be a 3-dimensional representation; a matrix, a graph, or other suitable mathematical representation that equates to the 3-dimensional representation or a portion thereof (e.g., a slice of the 3-dimensional representation); and the like.

In some instances, fluorine-containing fluids (with or, preferably, without hydrogen atoms) may be used as the chamber fluid and both 1H and 19F NMR measurements may be taken of the core sample. Similar to 1H NMR measurements, 19F NMR measurements may include, but are not limited to, T1 (spin-lattice) signal intensity, T2 (spin-spin) signal intensity, T1 relaxation times, and T2 relaxation times. Again, the properties of the core sample like porosity, movable and non-movable fluids, hydrocarbon fluid types and saturation, wettability, organic content, pore structure including pore size distribution, permeability, fracture and pore connectivity, and the like, and any combination thereof may be derived from 1H and 19F NMR measurements. One skilled in the art will recognize how to derive properties of the core samples from NMR measurements.

Further, by using the fluorine-containing fluid and conducting NMR imaging measurements, 1H and 19F NMR measurements may be converted to image of the hydrogen-containing fluid and fluorine-containing fluid, respectively, by known methods. As used herein, the term "1H image" refers to an image of the 1H NMR measurements. As used herein, the term "19F image" refers to an image of the 19F NMR measurements.

In some embodiments, the porosity of the core sample may be derived by analyzing the NMR signal of individual data points in the 1H and 19F images (e.g., voxels for 3-dimensional representations and n,m locations in matrices).

Further, by comparing the 1H and 19F images, the extent of fluid infiltration from the fluorine-containing fluid into the core sample may be derived. For example, portion of the 1H and 19F images that overlap or portions of the 19F image that encroach where the 1H image indicates the boundaries of the core sample (e.g., assuming a cylindrical core sample corresponding to the 1H image) may indicate that portions of the core sample have been infiltrated with the fluorine-containing fluid. To discern between infiltrated fluorine-containing fluid and a chip in the core sample, the data points in the portions of the 19F image in the presumed infiltration location may be compared the data points that are clearly fluorine-containing fluid. If the value of the data points (e.g., the value of the 19F NMR measurement) are similar for both (e.g., within 80% of each other), then the presumed infiltration location is likely a chip or other defect in the core sample.

In some embodiments, the 1H and 19F NMR measurements for each data point may be individually calibrated against the 1H NMR measurement for water and the 19F NMR measurement for the fluorine-containing fluid, respectively, which are referred to herein as calibrated 1H NMR measurements and calibrated 19F NMR measurements, respectively. As used herein, the term "calibrated 1H image" refers to an image of the calibrated 1H NMR measurements. As used herein, the term "calibrated 19F image" refers to an image of the calibrated 19F NMR measurements.

In some instances, analyzing the NMR measurements may involve summing the calibrated 1H images and calibrated 19F images to yield the collective intensities of each pixel of the images. This applies to cases when if the fluorine-containing fluid has invaded the core sample under investigation. In this approach, the boundary of the core plug can be identified from the proton image. Within the same volume of the same boundary, the 19F image intensities are analyzed either collectively or pixel by pixel. The porosity of the entire core sample volume is represented by the summation of the calibrated proton intensity and the 19F intensities within the volume, or the intensities are computed pixel-by-pixel to yield a porosity distribution image inside the porous rock space. In some instances, analyzing the NMR measurements may involve computing the calibrated 19F pixel intensity image corresponding to the pixels in the core sample volume to obtain the fluorine-containing fluid infiltration image into the core plug sample. In some instances, the infiltration image of the core plug sample may include an overlay of the calibrated 1H image, where the latter defines the volume boundary of core plug sample. The foregoing methods may be used on a variety of lithologies (i.e., rock types) that compose subterranean formations including, but not limited to, sandstone, limestone, dolostone, claystone, coal, shale, diatomite, and the like, and any combination thereof.

In some instances, carbonate lithologies like limestone and dolostone are vuggy (i.e., contain cavities about 1 mm or larger in the rock). In traditional core sample analysis, core samples are generally considered cylindrical and porosity is determined by the amount of water/hydrocarbon in the core. However, because the capillary forces are lower in vugs, much of the native fluid therein may escape the core sample from surface vugs under traditional analysis conditions. Methods described herein allow for a more accurate estimation of the core size, which results in a more accurate porosity value. For example, in some embodiments, analyzing the NMR measurements may involve subtracting the data points from the calibrated 19F image that have a calibrated 19F NMR measurement that is not approximately the same as (e.g., at least 20% more than or at least 20% less than) the calibrated 19F NMR measurement of the fluorine-containing fluid to yield a boundary image of the core sample where the negative space of the boundary image is an adjusted core volume. Then, the calibrated 1H NMR measurements and the calibrated 19F NMR measurements in the adjusted core volume may be analyzed by the various methods described herein to derive properties of the core sample (e.g., porosity, porosity images, infiltration images, and the like).

In some instances, the fluid pressure in the pressurized NMR core holder containing the core sample may be decreased in a controlled manner, for example, with a regulating valve, over time where one or more of the analysis methods described herein are performed at two or more pressures. By reducing fluid pressure and analyzing the core sample, the rate and amount the different native fluids release from the core sample (e.g., gas, liquid hydrocarbons, water, and the like) may be derived, which may mimic the manner and order in which the formation will release native fluids during a production operation. For example, some embodiments may involve retrieving the pressurized NMR core holder from the wellbore containing the core samples at downhole fluid saturation state and/or pressure conditions, maintaining the cores samples at the downhole fluid saturation state and/or pressure conditions until after collecting first NMR measurements on the core samples, reducing a fluid pressure in the pressurized NMR core holder, and performing second NMR measurements on the core samples. Then, both the first and second NMR measurements may independently be analyzed by any of the methods described herein.

The properties of the core samples and fluids contained therein may be used when designing and executing stimulation operations and production operations. For example, by collecting and analyzing (by one or more of the methods described herein) core samples at different locations within the subterranean formation, zones may be identified with high concentrations of hydrocarbons but low porosity, which may require additional stimulation (e.g., fracturing or acidizing). In another example, zones may be identified with high concentrations of movable water and be isolated during production operations so that hydrocarbon production is enhanced. In yet another example, zones may be identified that release some hydrocarbons readily but have significant residual hydrocarbons, which lead an operator to produce the readily released hydrocarbons first and then stimulate the zone to enhance production of the residual hydrocarbons.

The processor and corresponding computer hardware used to implement the various illustrative blocks, modules, elements, components, methods, and algorithms described herein may be configured to execute one or more sequences of instructions, programming stances, or code stored on a non-transitory, computer-readable medium (e.g., a non-transitory, tangible, computer-readable storage medium containing program instructions that cause a computer system running the program of instructions to perform method steps or cause other components/tools to perform method steps described herein). The processor can be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any like suitable entity that can perform calculations or other manipulations of data. In some embodiments, computer hardware can further include elements such as, for example, a memory (e.g., random access memory (RAM), flash memory, read only memory (ROM), programmable read only memory (PROM), erasable programmable read only memory (EPROM)), registers, hard disks, removable disks, CD-ROMS, DVDs, or any other like suitable storage device or medium.

Executable sequences described herein can be implemented with one or more sequences of code contained in a memory. In some embodiments, such code can be read into the memory from another machine-readable medium. Execution of the sequences of instructions contained in the memory can cause a processor to perform the methods and analyses described herein. One or more processors in a multi-processing arrangement can also be employed to execute instruction sequences in the memory. In addition, hard-wired circuitry can be used in place of or in combination with software instructions to implement various embodiments described herein. Thus, the present embodiments are not limited to any specific combination of hardware and/or software.

As used herein, a machine-readable medium will refer to any medium that directly or indirectly provides instructions to a processor for execution. A machine-readable medium can take on many forms including, for example, non-volatile media, volatile media, and transmission media. Non-volatile media can include, for example, optical and magnetic disks. Volatile media can include, for example, dynamic memory. Transmission media can include, for example, coaxial cables, wire, fiber optics, and wires that form a bus. Common forms of machine-readable media can include, for example, floppy disks, flexible disks, hard disks, magnetic tapes, other like magnetic media, CD-ROMs, DVDs, other like optical media, punch cards, paper tapes and like physical media with patterned holes, RAM, ROM, PROM, EPROM, and flash EPROM.

For example, the processor described herein may be configured for communicating with the NMR coil and related hardware to cause the NMR measurements (e.g., produce RF signals with the NMR coil and detect RF signals with the NMR coil from the core sample and fluid) and switch between the 1H operational mode and the 19F operational mode as needed. The processor may also be configured to perform the analyses and comparisons described herein. Further, the processor may produce an output that corresponds to the NMR measurements or analyses thereof.

Embodiments described herein include, but are not limited to, Embodiment A, Embodiment B, and Embodiment C.

Embodiment A is a method comprising: collecting one or more core samples from a subterranean formation with a coring tool coupled to a pressurized nuclear magnetic resonance (NMR) core holder; placing the one or more core samples in the pressurized NMR core holder comprising one or more NMR coils and containing a fluid; retrieving the pressurized NMR core holder from the subterranean formation where the one or more core samples at a downhole fluid saturation state; performing 1H NMR measurements on at least one of the one or more core samples in the pressurized NMR core holder at the downhole fluid saturation state; and deriving one or more properties of the at least one of the one or more core samples based on the 1H NMR measurements.

Embodiment A may optionally include one or more of the following: Element 1: wherein the fluid comprises one or more selected from the group consisting of a viscosifier and a weighting agent; Element 2: wherein the one or more properties of the at least one of the one or more core samples is selected from the group consisting of porosity, movable and non-movable fluids, hydrocarbon fluid types and saturation, wettability, organic content, pore structure including pore size distribution, permeability, and fracture and pore connectivity; Element 3: wherein the fluid is a hydrogen-absent fluid; Element 4: wherein the fluid comprise a fluorine-containing fluid and the method further comprises: performing 19F NMR measurements on the at least one of the one or more core samples at the downhole fluid saturation state; and deriving the one or more properties of the at least one of the one or more core samples based on the 1H NMR measurements and the 19F NMR measurements; Element 5: Element 4 and wherein deriving the one or more properties of the at least one of the one or more core samples comprises: producing a 1H image of the 1H NMR measurements; producing a 19F image of the 19F NMR measurements; and comparing the 1H image and the 19F image to derive where the fluorine-containing fluid has infiltrated the at least one of the one or more core samples; Element 6: Element 4 and wherein deriving the one or more properties of the at least one of the one or more core samples comprises: calibrating the 1H NMR measurements to a 1H NMR measurement of water to produce calibrated 1H NMR measurements; calibrating the 19F NMR measurements to a 19F NMR measurement of the fluorine-containing fluid to produce calibrated 19F NMR measurements; producing a calibrated 1H image of the calibrated 1H NMR measurements; and producing a calibrated 19F image of the calibrated 19F NMR measurements; Element 7: Element 6 and wherein deriving the one or more properties of the at least one of the one or more core samples further comprises: summing the calibrated 1H image and the calibrated 19F image; and deriving porosity of the at least one of the one or more core samples therefrom; Element 8: Element 6 and wherein deriving the one or more properties of the at least one of the one or more core samples further comprises: ensemble averaging data points of the calibrated 1H image and data points of the calibrated 19F image; and deriving porosity of the at least one of the one or more core samples therefrom; Element 9: Element 6 and wherein deriving the one or more properties of the at least one of the one or more core samples further comprises: subtracting data points of the calibrated 19F image having a value within 20% of a value of the fluorine-containing fluid to yield an infiltration image; Element 10: Element 6 and wherein deriving the one or more properties of the at least one of the one or more core samples further comprises: subtracting data points of the calibrated 19F image having a value at least 20% greater than or at least 20% less than of a value of the fluorine-containing fluid to yield a boundary image where a negative space of the boundary image is an adjusted core volume; and deriving the one or more properties of the at least one of the one or more core samples based on the 1H NMR measurements and/or the 19F NMR measurements that fall within the adjusted core volume; Element 11: Element 10 and wherein the subterranean formation comprises a carbonate lithology; Element 12: wherein the fluid comprises a perfluorohydrocarbon and a perfluoropolymer; and Element 13: wherein the 1H NMR measurements are first 1H NMR measurements and the method further comprises: reducing a fluid pressure in the pressurized NMR core holder to a reduced fluid pressure; and performing second 1H NMR measurements on the at least one of the one or more core samples in the pressurized NMR core holder at the downhole fluid saturation state. By way of nonlimiting examples, Embodiment A may include the following combinations: Element 1 in combination with one or more of Elements 2-13; Element 2 in combination with one or more of Elements 3-13; Element 3 in combination with one or more of Elements 4-13; Element 4 in combination with Element 12 and optionally in further combination with Element 13 and/or one or more of Elements 5-11; Element 4 in combination with Element 6 and two or more of Elements 7-10 and optionally in further combination with Element 11; and the like.

Embodiment B is a method comprising: collecting one or more core samples from a subterranean formation with a coring tool coupled to a pressurized nuclear magnetic resonance (NMR) core holder; placing the one or more core samples in the pressurized NMR core holder comprising one or more NMR coils and containing a fluid comprising a perfluorocarbon; retrieving the pressurized NMR core holder from the subterranean formation where the one or more core samples at a downhole fluid saturation state; performing 1H NMR measurements and 19F NMR measurements on at least one of the one or more core samples in the pressurized NMR core holder at the downhole fluid saturation state; and deriving one or more properties of the at least one of the one or more core samples based on the 1H NMR measurements and the 19F NMR measurements.

Embodiment B may optionally include one or more of the following: Element 1; Element 2; Element 5; Element 6; Element 7; Element 8; Element 9; Element 10; Element 11; Element 13; and Element 14: wherein the fluid further comprises a viscosifier that comprises a perfluoropolymer. By way of nonlimiting examples, Embodiment B may include the following combinations: Element 1 in combination with one or more of Elements 2, 5-11, and 13-14; Element 2 in combination with one or more of Elements 5-11 and 13-14; Element 6 in combination with two or more of Elements 7-10 and optionally in further combination with Element 11; Element 13 in combination with one or more of Elements 1-2, 5-11, and 14; Element 14 in combination with one or more of Elements 1-2, 5-11, and 13; and the like.

Embodiment C is a method comprising: collecting one or more core samples from a subterranean formation with a coring tool coupled to a pressurized nuclear magnetic resonance (NMR) core holder; placing the one or more core samples in the pressurized NMR core holder comprising one or more NMR coils and containing a fluid comprising a perfluorocarbon; retrieving the pressurized NMR core holder from the subterranean formation where the one or more core samples at a downhole fluid saturation state; performing 1H NMR measurements and 19F NMR measurements on at least one of the one or more core samples in the pressurized NMR core holder at the downhole fluid saturation state; calibrating the 1H NMR measurements to a 1H NMR measurement of water to produce calibrated 1H NMR measurements; calibrating the 19F NMR measurements to a 19F NMR measurement of the fluorine-containing fluid to produce calibrated 19F NMR measurements; producing a calibrated 1H image of the calibrated 1H NMR measurements; producing a calibrated 19F image of the calibrated 19F NMR measurements; and deriving one or more properties of the at least one of the one or more core samples based on the calibrated 1H image and the calibrated 19F image, wherein the one or more properties of the at least one of the one or more core samples is selected from the group consisting of porosity, movable and non-movable fluids, hydrocarbon fluid types and saturation, wettability, organic content, pore structure including pore size distribution, permeability, and fracture and pore connectivity.

Embodiment C may optionally include one or more of the following: Element 1; Element 7; Element 8; Element 9; Element 10; Element 11; Element 13; and Element 14. By way of nonlimiting examples, Embodiment C may include the following combinations: Element 1 in combination with one or more of Elements 7-11 and 13-14; two or more of Elements 7-10 in combination and optionally in further combination with Element 11; Element 13 in combination with one or more of Elements 1, 7-11, and 14; Element 14 in combination with one or more of Elements 1, 7-11, and 13; and the like.

Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention. At the very least, and not as an attempt to limit the application of the doctrine of equivalents to the scope of the claim, each numerical parameter should at least be construed in light of the number of reported significant digits and by applying ordinary rounding techniques.

One or more illustrative embodiments incorporating the invention embodiments disclosed herein are presented herein. Not all features of a physical implementation are described or shown in this application for the sake of clarity. It is understood that in the development of a physical embodiment incorporating the embodiments of the present invention, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for those of ordinary skill in the art and having benefit of this disclosure.

While compositions and methods are described herein in terms of "comprising" various components or steps, the compositions and methods can also "consist essentially of" or "consist of" the various components and steps.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. The invention illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

As used herein, the term "or" is inclusive unless otherwise explicitly noted. Thus, the phrase "at least one of A, B, or C" is satisfied by any element from the set {A, B, C} or any combination thereof, including multiples of any element.

The invention claimed is:

1. A method comprising:
 collecting a set of one or more core samples from a subterranean formation with a coring tool coupled to a pressurized nuclear magnetic resonance (NMR) core holder;
 placing the set of one or more core samples in the pressurized NMR core holder comprising one or more NMR coils and containing a fluid comprising a perfluorocarbon;
 retrieving the pressurized NMR core holder from the subterranean formation where the set of one or more core samples is at a downhole fluid saturation state;
 performing NMR measurements on the set of one or more core samples in the pressurized NMR core holder at the downhole fluid saturation state, wherein performing the NMR measurements comprises performing at least one of 1H NMR measurements and 19F NMR measurements; and
 deriving one or more properties of the set of one or more core samples based on the NMR measurements.

2. The method of claim 1, wherein the fluid comprises one or more of a viscosifier and a weighting agent.

3. The method of claim 2, wherein the viscosifier comprises a perfluoropolymer.

4. The method of claim 1, wherein deriving the one or more properties of the set of one or more core samples comprises:
 calibrating the 1H NMR measurements to a 1H NMR measurement of water to produce calibrated 1H NMR measurements; and
 producing a calibrated 1H image of the calibrated 1H NMR measurements, wherein deriving the one or more properties of the set of one or more core samples is based on the calibrated 1H image.

5. The method of claim 1, wherein deriving the one or more properties of the set of one or more core samples comprises:
 calibrating the 19F NMR measurements to a 19F NMR measurement of a fluorine-containing fluid to produce calibrated 19F NMR measurements; and
 producing a calibrated 19F image of the calibrated 19F NMR measurements, wherein deriving the one or more properties of the set of one or more core samples is based on the calibrated 19F image.

6. The method of claim 1, wherein the one or more properties of the set of one or more core samples is selected from the group consisting of porosity, movable and non-movable fluids, hydrocarbon fluid types and saturation, wettability, organic content, pore structure including pore size distribution, permeability, and fracture and pore connectivity.

7. The method of claim 1, further comprising:
 reducing a fluid pressure in the pressurized NMR core holder after performing the NMR measurements on the set of one or more core samples in the pressurized NMR core holder at the downhole fluid saturation state;

performing the NMR measurements on the set of one or more core samples in the pressurized NMR core holder at the reduced fluid pressure, wherein performing the NMR measurements comprises performing at least one of 1H NMR measurements and 19F NMR measurements; and deriving the one or more properties of the set of one or more core samples based on the NMR measurements at the downhole fluid saturation state and the NMR measurements at the reduced fluid pressure.

8. A system comprising:
a coring tool;
a pressurized nuclear magnetic resonance (NMR) core holder coupled to the coring tool, wherein the pressurized NMR core holder comprises,
  a housing capable of containing downhole conditions,
  one or more NMR coils, and
  a core chamber containing a fluid comprising a perfluorocarbon;
a control system connected to the pressurized NMR core holder; and
a computer-readable medium having instructions stored thereon that are executable by the control system to cause the system to,
  collect into the core chamber a set of one or more core samples from a subterranean formation with the coring tool,
  retrieve the pressurized NMR core holder from the subterranean formation where the set of one or more core samples is at a downhole fluid saturation state,
  perform NMR measurements on the set of one or more core samples in the pressurized NMR core holder at the downhole fluid saturation state, wherein the instructions to perform NMR measurements comprise instructions to perform at least one of 1H NMR measurements and 19F NMR measurements, and
  derive one or more properties of the set of one or more core samples based on the NMR measurements.

9. The system of claim 8, wherein the fluid further comprises one or more of a viscosifier and a weighting agent.

10. The system of claim 9, wherein the fluid further comprises a viscosifier that comprises a perfluoropolymer.

11. The system of claim 8, wherein the instructions to derive the one or more properties of the set of one or more core samples comprises instructions to:
calibrate the 1H NMR measurements to a 1H NMR measurement of water to produce calibrated 1H NMR measurements; and
produce a calibrated 1H image of the calibrated 1H NMR measurements, wherein the instructions to derive the one or more properties of the set of one or more core samples are based on the calibrated 1H image.

12. The system of claim 8, wherein the instructions to derive the one or more properties of the set of one or more core samples comprises instructions to:
calibrate the 19F NMR measurements to a 19F NMR measurement of a fluorine-containing fluid to produce calibrated 19F NMR measurements; and
produce a calibrated 19F image of the calibrated 19F NMR measurements, wherein the instructions to derive the one or more properties of the set of one or more core samples are based on the calibrated 19F image.

13. The system of claim 8, wherein the one or more properties of the set of one or more core samples is selected from the group consisting of porosity, movable and non-movable fluids, hydrocarbon fluid types and saturation, wettability, organic content, pore structure including pore size distribution, permeability, and fracture and pore connectivity.

14. The system of claim 8, further comprising instructions to:
reduce a fluid pressure in the pressurized NMR core holder after performing the NMR measurements on the set of one or more core samples in the pressurized NMR core holder at the downhole fluid saturation state;
perform NMR measurements on the set of one or more core samples in the pressurized NMR core holder at the reduced fluid pressure, wherein the instructions to perform NMR measurements comprise instructions to perform at least one of 1H NMR measurements and 19F NMR measurements; and
derive the one or more properties of the set of one or more core samples based on the NMR measurements at the downhole fluid saturation state and the NMR measurements at the reduced fluid pressure.

15. A non-transitory, computer-readable medium having instructions stored thereon that are executable by a computing device to perform operations comprising:
collecting a set of core samples from a subterranean formation with a coring tool coupled to a pressurized nuclear magnetic resonance (NMR) core holder;
placing the set of core samples in the pressurized NMR core holder comprising one or more NMR coils and containing a fluid comprising a perfluorocarbon;
retrieving the pressurized NMR core holder from the subterranean formation where the set of core samples is at a downhole fluid saturation state;
performing NMR measurements on the set of core samples in the pressurized NMR core holder at the downhole fluid saturation state, wherein performing the NMR measurements comprises performing at least one of 1H NMR measurements and 19F NMR measurements; and
deriving one or more properties of the set of core samples based on the NMR measurements.

16. The non-transitory, computer-readable medium of claim 15, wherein the fluid comprises one or more of a viscosifier and a weighting agent.

17. The non-transitory, computer-readable medium of claim 16, wherein the fluid further comprises a viscosifier that comprises a perfluoropolymer.

18. The non-transitory, computer-readable medium of claim 15, wherein the instructions for deriving the one or more properties of the set of core samples comprise instructions to perform operations comprising:
calibrating the 1H NMR measurements to a 1H NMR measurement of water to produce calibrated 1H NMR measurements; and
producing a calibrated 1H image of the calibrated 1H NMR measurements, wherein the instructions to perform operations comprising deriving the one or more properties of the set of core samples are based on the calibrated 1H image.

19. The non-transitory, computer-readable medium of claim 15, wherein the instructions for deriving the one or more properties of the set of core samples comprise instructions to perform operations comprising:
calibrating the 19F NMR measurements to a 19F NMR measurement of a fluorine-containing fluid to produce calibrated 19F NMR measurements; and
producing a calibrated 19F image of the calibrated 19F NMR measurements, wherein the instructions to perform operations comprising deriving the one or more properties of the set of core samples are based on the calibrated 19F image.

20. The non-transitory, computer-readable medium of claim 15, further comprising instructions to perform operations comprising:

reducing a fluid pressure in the pressurized NMR core holder after performing the NMR measurements on the set of core samples in the pressurized NMR core holder at the downhole fluid saturation state;

performing NMR measurements on the set of core samples in the pressurized NMR core holder at the reduced fluid pressure, wherein performing the NMR measurements comprises performing at least one of 1H NMR measurements and 19F NMR measurements; and deriving the one or more properties of the set of core samples based on NMR measurements at the downhole fluid saturation state and the NMR measurements at the reduced fluid pressure.

* * * * *